US008882296B2

(12) United States Patent
Chen et al.

(10) Patent No.: US 8,882,296 B2
(45) Date of Patent: Nov. 11, 2014

(54) LIGHT EMITTING DIODE MODULE AND DISPLAY DEVICE USING THE SAME LIGHT EMITTING DIODE MODULE

(75) Inventors: Sheng-Wen Chen, Hsin-Chu (TW); Wen-Kuei Liu, Hsin-Chu (TW); Yu-Min Hung, Hsin-Chu (TW); Tsai-Fen Lee, Hsin-Chu (TW); Yung-Hsiang Tsao, Hsin-Chu (TW)

(73) Assignee: Au Optronics Corp., Hsin-Chu (TW)

( * ) Notice: Subject to any disclaimer, the term of this patent is extended or adjusted under 35 U.S.C. 154(b) by 466 days.

(21) Appl. No.: 13/438,066

(22) Filed: Apr. 3, 2012

(65) Prior Publication Data
US 2013/0056769 A1    Mar. 7, 2013

(30) Foreign Application Priority Data
Sep. 1, 2011    (TW) .............................. 100131558 A

(51) Int. Cl.
*F21V 21/002*    (2006.01)

(52) U.S. Cl.
USPC ...................... 362/249.02; 362/97.3; 362/800

(58) Field of Classification Search
USPC .................................... 362/97.3, 249.02, 800
See application file for complete search history.

(56) References Cited

U.S. PATENT DOCUMENTS

| 8,319,429 | B2 | 11/2012 | Wu et al. | |
|---|---|---|---|---|
| 8,337,214 | B2* | 12/2012 | Sheek | 439/56 |
| 2008/0277677 | A1* | 11/2008 | Kuo et al. | 257/91 |
| 2012/0057358 | A1 | 3/2012 | Wu et al. | |

FOREIGN PATENT DOCUMENTS

CN        102005527 A        4/2011

OTHER PUBLICATIONS

China Patent Office, "Office Action", Mar. 21, 2014.

* cited by examiner

Primary Examiner — Y My Quach Lee
(74) Attorney, Agent, or Firm — WPAT, PC; Justin King

(57) ABSTRACT

A light emitting diode (LED) module and a display device adopting the same LED module are provided. The LED module includes a circuit substrate, a LED chip, a connector and a conductive line. The LED chip has at least three pins, and the LED chip is fixed on the circuit substrate through the pins, wherein one of the pins is defined as a no connection (NC) pin. The connector includes a non-conductive housing, at least one fixing pin and a conductor. The fixing pin is connected to the non-conductive housing, and the non-conductive housing is fixed on the circuit substrate through the said at least one fixing pin. A part of the non-conductive housing is covered with the conductor. The conductive line is disposed on the circuit substrate and is electrically connected between the conductor and the NC pin.

16 Claims, 4 Drawing Sheets

LIGHT EMITTING DIODE MODULE AND DISPLAY DEVICE USING THE SAME LIGHT EMITTING DIODE MODULE

TECHNICAL FIELD

The present invention relates to a light emitting diode (LED) module for a flat panel display, and more particularly to a LED module with an Electro-Static discharge (ESD) protection design and a display device adopting the same LED module.

BACKGROUND

In the existing technology, a backlight module of a liquid crystal display (LCD) mostly adopts a LED module as a light source. The LED module comprises a single LED chip or LED chips connected in series. However, the LED module in fabrication process is often touched by the operators, and it often causes the LED module to be damaged by ESD. Usually, a single LED chip or LED chips connected in series of the LED module will be damaged by ESD of only 5 KV.

SUMMARY

The present invention relates to a LED module with an ESD protection design. The LED module has the advantages of simple manufacturing process and low cost, and the brightness of its LED chip will not be affected.

The present invention also relates to another LED module with the same ESD protection design. The said another LED module also has the advantages of simple manufacturing process and low cost, and the brightness of its LED chip will not be affected.

The present invention also relates to two types of the display devices that adopt the above-mentioned two types of the LED modules respectively.

The present invention provides a LED module, which comprises a circuit substrate, a first LED chip, a connector and a conductive line. The first LED chip has at least three pins, and the first LED chip is fixed on the circuit substrate through the pins, wherein one of the pins is defined as a first no connection (NC) pin. The connector includes a non-conductive housing, at least one fixing pin and a conductor. The fixing pin is connected to the non-conductive housing, and the non-conductive housing is fixed on the circuit substrate through the said at least one fixing pin. A part of the non-conductive housing is covered with the conductor. The conductive line is disposed on the circuit substrate and is electrically connected between the conductor and the first NC pin.

In the said another LED module, a circuit substrate has a through hole, and a conductive element is disposed in the through hole. The conductive element is electrically connected to at least one fixing pin of the connector and the NC pins of the LED chips. In addition, both the LED module and the metal backplane of the flat display device are designed with a proper mechanism design, so that the conductor can electrically contact the mental backplane when the LED module has been assembled with the metal backplane. Thus, when ESD event occurs near the opening of the connector of the LED module, the Electro-Static energy can be induced to the metal backplane through the said at least one fixing pins of the connector and the conductive element. In addition, when ESD event occurs near the LED chip, the Electro-Static energy can be induced to the metal backplane through the NC pins of the LED chips, the conductive line, the fixing pins of the connector and the conductive element.

The present invention further provides a display device. The display device comprises a display panel, a light emitting diode module, and a metal backplane. The light emitting diode module is used for providing light source to the display panel. The light emitting diode comprises a circuit substrate, a first light emitting diode chip, a connector, at least one conductive element, and a conductive line. The circuit substrate has a first surface and a second surface, and the circuit substrate further has at least one through hole. The first light emitting diode chip has at least three pins and is fixed on the circuit substrate through the pins, and one of the pins is defined as a first no connection pin. The connector comprises at least one fixing pin and is disposed on the circuit substrate. The said at least one conductive element is disposed in the said at least one through hole and is electrically connected to the fixing pin. The conductive line is disposed on the circuit substrate and is electrically connected between the fixing pin and the first no connection pin. The metal backplane is electrically connected to the said at least one conductive element.

From the description mentioned above, it can be seen that all of the various LED modules of the present invention are designed with an ESD protection design. Since there is not necessarily to add extra Zener-Diode, the LED modules in the present invention have the advantages of simple manufacturing process and low cost. In addition, the brightness of the LED chip will not be affected.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

First Embodiment

Figure 1:
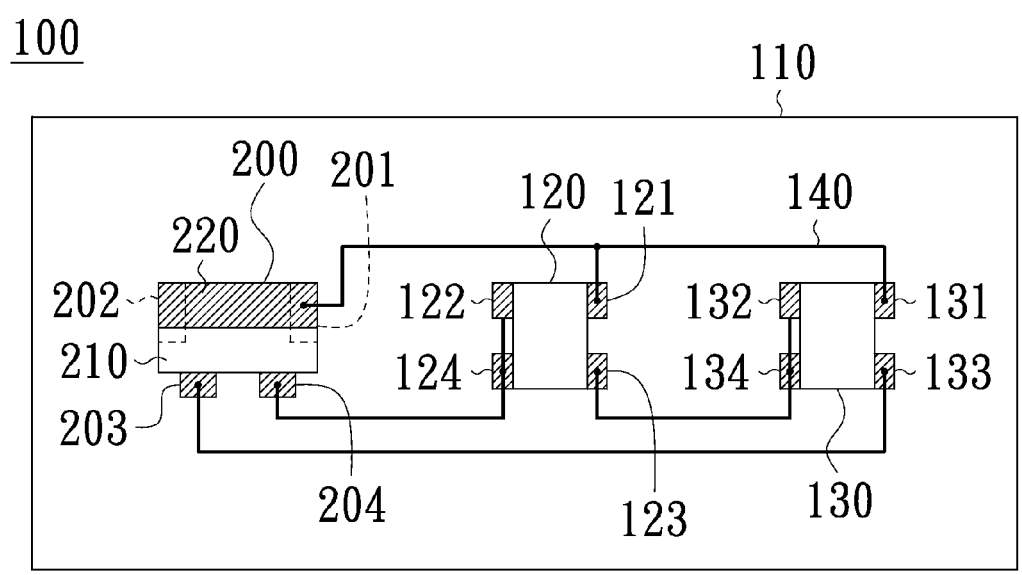
FIG. 1 is a top view of a LED module according to one embodiment of the present invention.

FIG. 1 is a top view of a LED module according to one embodiment of the present invention. Referring to FIG. 1, the LED module 100 comprises a circuit substrate 110, a first LED chip 120, a second LED chip 130, a conductive line 140 and a connector 200. In this embodiment, the first LED chip 120 has four pins that are denoted by labels 121, 122, 123, and 124, respectively. The first LED chip 120 is fixed on the circuit substrate 110 through the pins 121, 122, 123, and 124. In addition, the pin 121 is defined as a first no connection (NC) pin. The second LED chip 130 also has four pins that are denoted by labels 131, 132, 133, and 134, respectively. The second LED chip 130 is fixed on the circuit substrate 110 through the pins 131, 132, 133, and 134. In addition, the pin 131 is defined as a second NC pin.

The connector 200 includes a non-conducive housing 210, a conductor 220, a fixing pin 201, a fixing pin 202, a first power source pin 203, and a second power source pin 204. The fixing pins 201 and 202 are both connected to the non-conducive housing 210, and the non-conducive housing 210 is fixed on the circuit substrate 110 through the two fixing pins 201 and 202. The fixing manner could, for example, be a buckle-fixed manner or a screw fixed manner. In addition, a designer can also connect the fixing pins 201 and 202 with the connector 200 by soldering tin to fix the non-conducive housing 210 on the circuit substrate 110. The number of the fixing pins can be adjusted based on actual requirements. The more fixing pins the connector has, the more securer the connector would be. In addition, it may allow a single fixing pin to be used herein if the connection reliability is acceptable. The first power source pin (e.g., a GND pin) 203 is disposed on the circuit substrate 110 and is electrically connected to the pin 133 of the second LED chip 130 through a conductive line (not shown) of the circuit substrate 110. The second power source pin (e.g., a VDD pin) 204 is disposed on the circuit substrate 110 and is electrically connected to the pins 124 and 122 of the first LED chip 120 through a conductive line (not shown) of the circuit substrate 110. This is because the functions of the pins 124 and 122 are defined with the same definition. A designer may electrically connect the second power source pin 204 with one of the pins 124 and 122 to achieve the same object. The pin 123 of the first LED chip 120 is electrically connected to the pins 134 and 132 of the second LED chip 130. This is because the functions of the pins 134 and 132 are defined with the same definition. A designer may electrically connect the pin 123 with one of the pins 134 and 132 to achieve the same object. Although the above description describes that the first LED chip 120 and the second LED chip 130 are connected in series for an example, the above connection manner is not a limitation in the present invention. In other words, the LED chips of the present invention may be connected in parallel. A part of the non-conductive housing 210 is covered with the conductor 220. In an executable embodiment, the conductor 220 can be further electrically connected to the fixing pins 201 and 202. The detailed descriptions for the conductor 220 will be described by FIG. 2A and FIG. 2B. The conductive line 140 is disposed on the circuit substrate 110, and the conductive line 140 can be directly electrically connected to the conductor 220 or be electrically connected to the conductor 220 through the fixing pin 201. Besides, the conductive line 140 is electrically connected to the first NC pin (i.e., the pin 121) and the second NC pin (i.e., the pin 131).

Figure 2A:
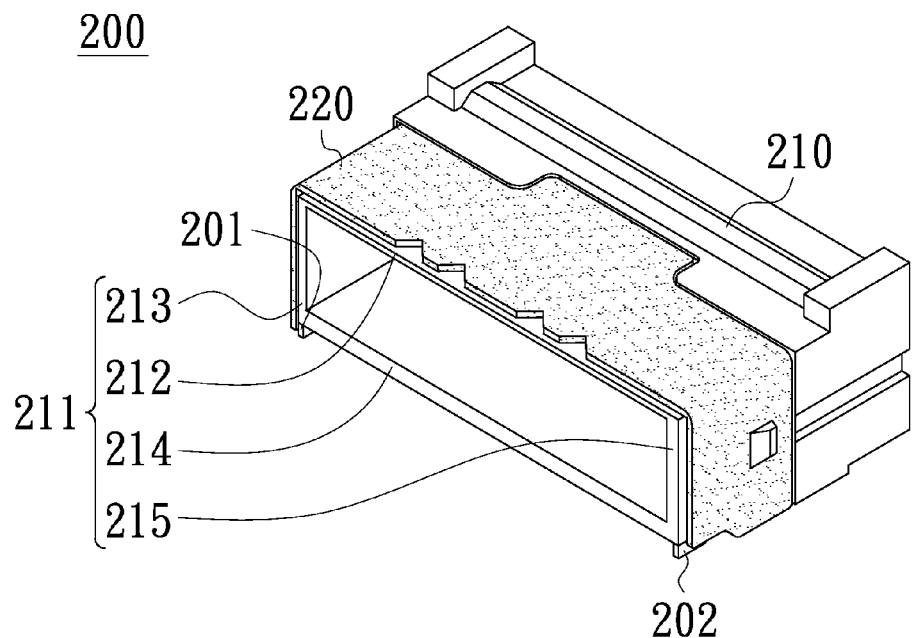
FIG. 2A is a stereoscopic diagram of a connector as shown in FIG. 1.

FIG. 2A is a stereoscopic diagram of the connector as shown in FIG. 1. Referring to FIG. 2A, the non-conductive housing 210 of the connector 200 has an opening 211 with four outer sides. Wherein the four outer sides are denoted by labels 212, 213, 214, and 215 respectively. The outer side 212 is fixed between the opening 211 and the circuit substrate 110 shown in FIG. 1 through the fixing pins 201 and 202. In this embodiment, the conductor 220 covers the outer sides 213, 214 and 215, and the conductor 220 covers at least parts of each covered outer side.

Figure 2B:
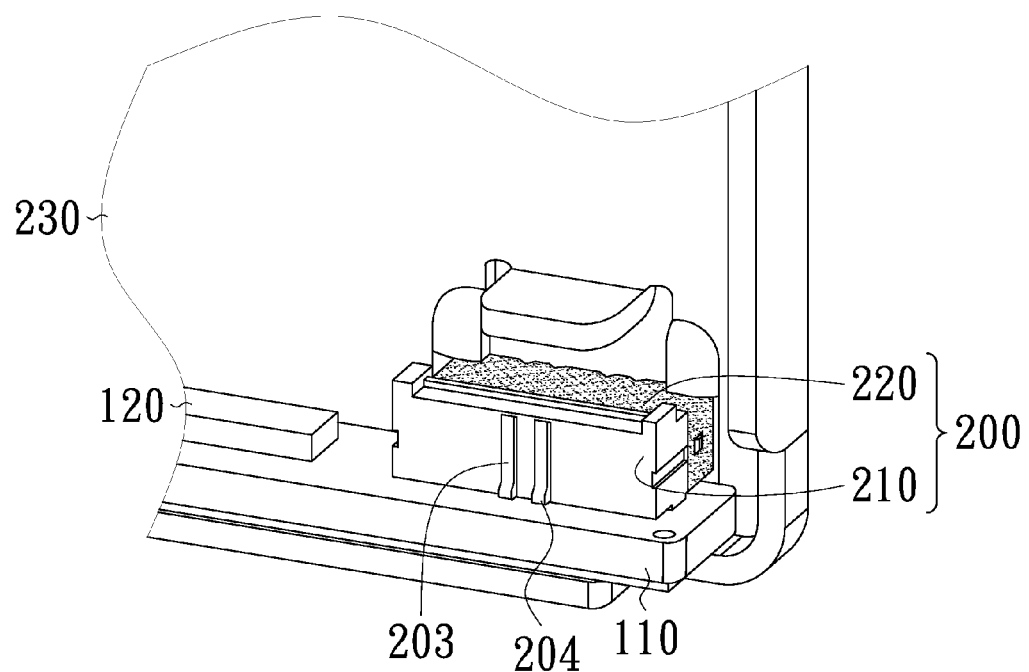
FIG. 2B is a diagram for showing the relation between the LED module as shown in FIG. 1 and a mental backplane of a flat panel display.

FIG. 2B is a diagram for showing the relation between the LED module as shown in FIG. 1 and a metal backplane of a flat panel display. In FIG. 2B, the object which is the same as that in FIG. 1 is labeled by the same label. As shown in FIG. 2B, both of the the LED module and the metal backplane 230 of the flat display device are designed with a proper mechanism design, so that the conductor 220 of the connector 200 can electrically contact the metal backplane 230 when the LED module has been assembled with the metal backplane. In addition, the metal backplane 230 is disposed behind a display panel (not shown).

From the description mentioned above, it can be seen that once ESD event occurs near the opening 211 of the connector 200 after the LED module 100 has been assembled with the metal backplane 230, the Electro-Static energy can be induced to the metal backplane 230 through the conductor 220 near the opening 211. Furthermore, once ESD event occurs near the LED chip 120 or LED chip 130, the Electro-Static energy can be induced to the metal backplane through the NC pins of the LED chips, the conductive line 140 and the conductor 220. In the present invention, the so-called ground does not necessarily be the earth. In other words, any large conductor that can sufficiently share the charge of the Electro-Static to achieve ESD protection can be served as the "ground". Besides, as long as the metal backplane 230 is electrically connected to the earth's crust to form the earth ground, the LED module 100 can be connected to the earth through the conductor 220.

Although each LED chip in this embodiment has four pins, and two of the four pins are electrically connected to the second power source pin (i.e., a VDD pin) 204, this is not a limitation in the present invention. For example, each LED chip may have only three pins. One is used as an anode, another is used as a cathode, and the third is used as a NC pin. In addition, the conductive line 140 can only be electrically connected to the fixing pin 202 or be electrically connected to the fixing pins 201 and 202. Certainly, the conductor can cover at least two of all outer sides (e.g. 5 outer sides) of the opening of the non-conductive housing, and the conductor can cover at least parts of each covered outer side.

Second Embodiment

Figure 3:
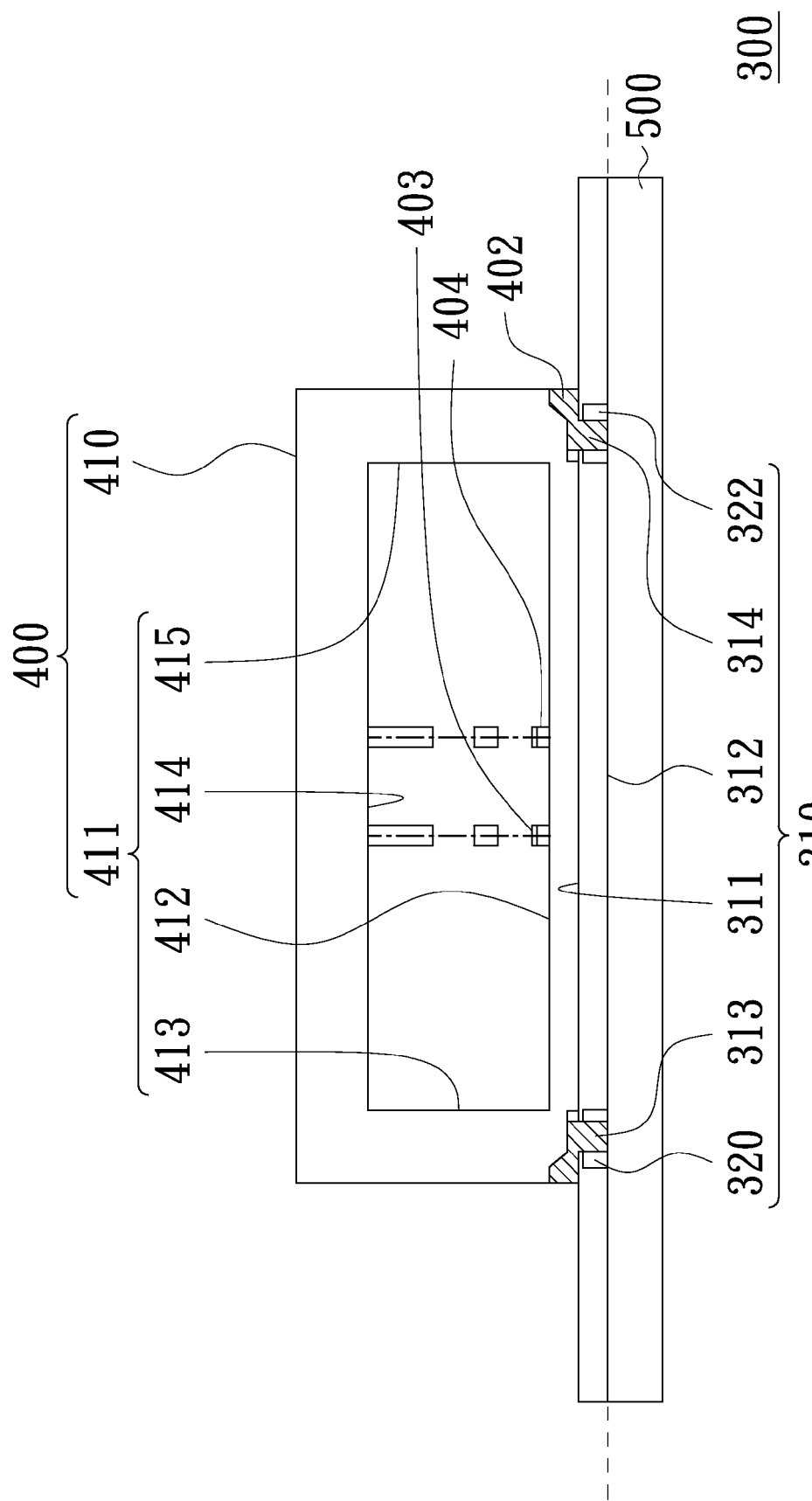
FIG. 3 is a cross-section diagram corresponding to a part of a LED module of another embodiment in the present invention.

FIG. 3 is a cross-section diagram corresponding to a part of the LED module of another embodiment in the present invention. In FIG. 3, the portion above the horizontal dotted line is a LED module 300, and the potion below the horizontal dotted line is a metal substrate 500 of a flat display device. The difference between the LED module 300 shown in FIG. 3 and the LED module 100 shown in FIG. 1 is that the LED module 300 is electrically connected to the metal substrate 500 by at least one conductive through hole. The details will be described as follows.

As shown in FIG. 3, the circuit substrate 310 of the LED module 300 has a first surface 311 and a second surface 312, and the circuit substrate 310 further has through holes 313 and 314. A conductive element 320 and a conductive element 322 are disposed in the through holes 313 and 314 respectively, thus forming two conductive through holes. The conductive elements 320 and 322 can be, for example, metal materials (e.g., Cu or Sn) coated in the through holes or can be conductive materials disposed or filled in the through holes. In addition, the conductive elements 320 and 322 can be replaced by the fixing pins 401 and 402 respectively as long as the two fixing pings are stretched and are inserted in the through holes. The conductive elements 320 and 322 are electrically connected to the fixing pins 401 and 402 of the connector 400, respectively. FIG. 3 shows merely an embodiment of the connector 400. In addition, the metal connection portions of the connector 400 such as the first power source pin 403 and the second power source pin 404 can be designed as gold-fingers to connect with external power sources. The connector 400 in this embodiment has a non-conductive housing 410, a first power source pin 403 and a second power source pin 404, and the locations of the first and power source pin 403 and the second power source pin 404 can be switched based on actual requirements. Besides, the non-conductive housing 410 has an opening 411, and the opening 411 has four outer-sides which are denoted by labels 412, 413, 414, and 415, respectively. The outer side 412 is fixed between the first surface 311 of the circuit substrate 301 and the opening 411 through the fixing pins 401 and 402.

From the description mentioned above, it can be seen that once ESD event occurs near the opening 411 of the connector 400 after the LED module 300 has been assembled with the metal backplane 500, the Electro-Static energy can be induced to the metal plane 500 through the fixing pins of the connector 400 and the conductive elements in the through holes. Furthermore, once ESD event occurs near any LED chip, the Electro-Static energy can be induced to the metal substrate 500 through the NC pins of the said LED chip, the conductive line, the fixing pins of the conductor 400, and the said conductive elements. In the present invention, the so-called ground does not necessarily be the earth. In other words, any large conductor that can sufficiently share the charge of the Electro-Static to achieve ESD protection can be served as the "ground". Besides, as long as the metal backplane 500 is electrically connected to the earth's crust to form the earth ground, the LED module 300 can be connected to the earth through the conductor 220.

Although this embodiment adopts two through holes, one skilled in the art should know that the present invention can be implemented as well by adopting just one through hole. Certainly, the connector 400 in the second embodiment can further include an attachment such as the conductor 220 or the like, so as to achieve ESD protection via the said attachment.

Third Embodiment

Figure 4:
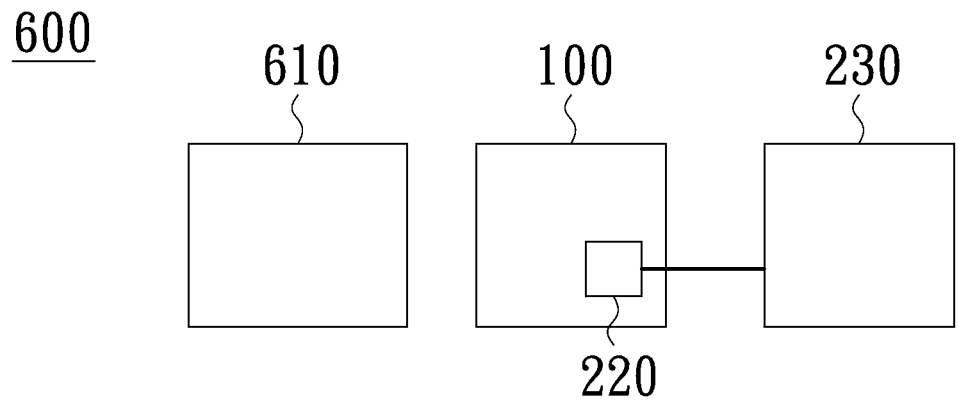
FIG. 4 is a schematic diagram of a display device according to one embodiment of the present invention.

FIG. 4 is a schematic diagram of a display device according to one embodiment of the present invention. The display device 600 comprises a display panel 610, the LED module 100 having the conductive element 220 as described in the first embodiment, and the metal backplane 230. The LED module 100 is used for providing light source to the display panel 610, and the metal backplane 230 is electrically connected to the conductor 220.

Fourth Embodiment

Figure 5:
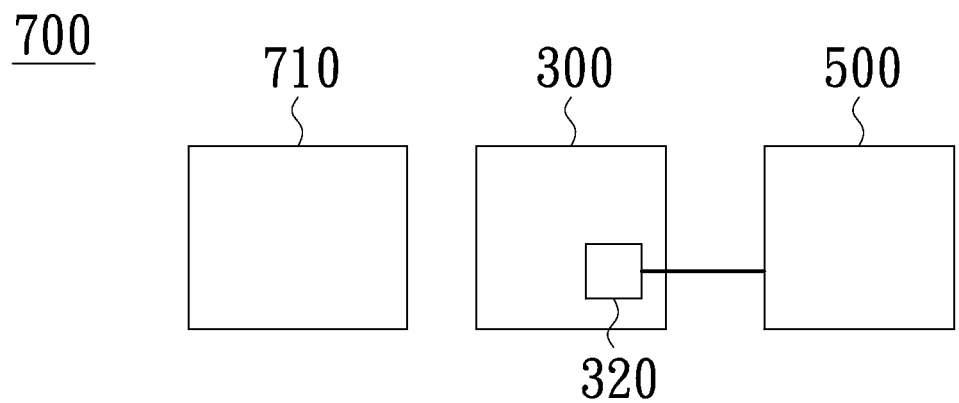
FIG. 5 is a schematic diagram of a display device according to another embodiment of the present invention.

FIG. 5 is a schematic diagram of a display device according to another embodiment of the present invention. This display device 700 comprises a display panel 710, the LED module 300 having the conductive element 320 as described in the second embodiment, and the metal substrate 500. The LED module 300 is used for providing light source to the display panel 710, and the metal substrate 500 is electrically connected to at least one conductive element 320.

To sum up, in one embodiment of the LED modules of the present invention, the outer surface of the opening of the non-conducive housing of the connector is covered with a conductor, and the conductor is electrically connected to the fixing pins of the connector and the NC pins of the LED chip. Furthermore, both the LED module and the metal backplane of the flat display device are designed with a proper mechanism design, so that the conductor can electrically contact the mental backplane when the LED module has been assembled with the metal backplane. Thus, when ESD event occurs near the opening of the connector, the Electro-Static energy can be induced to the metal backplane through the conductor. In addition, when ESD event occurs near any LED chip, the Electro-Static energy can be induced to the metal backplane through the NC pin of the said LED chip, the conductive line, and the conductor.

In another embodiment of the LED modules of the present invention, the circuit substrate has a through hole, and a conductive element is disposed in the through hole. The conductive element is electrically connected to the fixing pins of the connector and the NC pins of the LED chips. Besides, both the LED module and the metal backplane of the flat display device are designed with a proper mechanism design, so that the conductor can electrically contact the mental backplane when the LED module has been assembled with the metal backplane. Thus, when ESD event occurs near the opening of the connector, the Electro-Static energy can be induced to the metal backplane through the fixing pings of the connector and the said conductive element. In addition, when ESD event occurs near any LED chip, the Electro-Static energy can be induced to the metal backplane through the NC pins of the LED chips, the conductive line, the fixing pins of the connector, and the conductive element.

From the description mentioned above, it can be seen that all of the various LED modules of the present invention are designed with an ESD protection design. Since there is no need to add any extra Zener-Diode, the LED modules in the present invention have the advantages of simple manufacturing process and low cost. In addition, the brightness of the LED chip will not be affected. Compared with other ESD protection manners, the present invention has shorter ESD discharging paths (i.e., the discharging paths from the place where ESD event occurs to the housing of the display device). Hence, the resistance of the discharging path of the present invention is relatively small, and the discharging ability of the present invention is relatively high. In addition, the effect of the ESD protection in the present invention is better. It is noted that if the LED modules in the present invention are designed with Zener-Diodes as mentioned in the prior art, the LED modules can achieve better ESD protection.

Any of the embodiments or claims of the present invention needs not reach all purposes or advantages or features disclosed in the present invention. Besides, a part of the abstract and the title are only provided to assist patent search and it is submitted with the understanding that it will not be used to limit the scope of the claims.

While the invention has been described in terms of what is presently considered to be the most practical and preferred embodiments, it is to be understood that the invention needs not be limited to the disclosed embodiment. On the contrary, it is intended to cover various modifications and similar arrangements included into the spirit and scope of the appended claims which are to be accorded with the broadest interpretation so as to encompass all such modifications and similar structures.

What is claimed is:
1. A light emitting diode module, comprising:
a circuit substrate;

a first light emitting diode chip, having at least three pins and being fixed on the circuit substrate through the pins, and one of the pins being defined as a first no connection pin;
a connector, comprising:
a non-conductive housing;
at least one fixing pin, connected to the non-conductive housing, wherein the non-conductive housing is fixed on the circuit substrate through the said at least one fixing pin; and
a conductor, covering a part of the non-conductive housing; and
a conductive line, disposed on the circuit substrate and electrically connected between the conductor and the first no connection pin.

2. The light emitting diode module according to claim 1, wherein the non-conductive housing has an opening with four outer sides, and one of the outer sides is fixed between the circuit substrate and the opening through the said at least one fixing pin, and the conductor covers at least two outer sides of the remaining outer sides and covers at least part areas of the covered outer sides.

3. The light emitting diode module according to claim 1, wherein the connector further comprises:
a first power source pin, disposed on the circuit substrate and electrically connected to one of the remaining two pins of the first light emitting diode chip through the circuit substrate; and
a second power source pin, disposed on the circuit substrate and electrically connected to the other one of the remaining two pins of the first light emitting diode chip through the circuit substrate.

4. The light emitting diode module according to claim 1, further comprising:
a second light emitting diode chip, having at least three pins and being disposed on the circuit substrate through the pins, and one of the pins being defined as a second no connection pin, wherein the second no connection pin is electrically connected to the first no connection pin through the conductive line.

5. The light emitting diode module according to claim 1, wherein the light emitting diode module is connected to a ground through the conductor.

6. The light emitting diode module according to claim 1, wherein the fixing pins are connected between the conductive line and the conductor.

7. A light emitting diode module, comprising:
a circuit substrate, having a first surface and a second surface, and the circuit substrate further having at least one through hole;
a first light emitting diode chip, having at least three pins and being fixed on the circuit substrate through the pins, and one of the pins being defined as a first no connection pin;
a connector, comprising at least one fixing pin and being disposed on the circuit substrate;
at least one conductive element, disposed in the said at least one through hole and electrically connected to the fixing pin; and
a conductive line, disposed on the circuit substrate and electrically connected between the fixing pin and the first no connection pin.

8. The light emitting diode module according to claim 7, wherein the connector further comprises a non-conductive housing, the non-conductive housing is fixed on the first surface of the circuit substrate through the said at least one fixing pin, the non-conductive housing has a opening with four outer sides, and one of the four outer sides is fixed between the first surface of the circuit substrate and the opening through the said at least one fixing pin.

9. The light emitting diode module according to claim 7, wherein the connector further comprises:
a first power source pin, disposed on the circuit substrate and electrically connected to one of the remaining two pins of the first light emitting diode chip through the circuit substrate; and
a second power source pin, disposed on the circuit substrate and electrically connected to the other one of the remaining two pins of the first light emitting diode chip through the circuit substrate.

10. The light emitting diode module according to claim 7, further comprising:
a second light emitting diode chip, having at least three pins and being fixed on the circuit substrate through the pins, and one of the pins being defined as a second no connection pin;
wherein the second no connection pin is electrically connected to the first no connection pin through the conductive line.

11. The light emitting diode module according to claim 7, wherein the light emitting diode module is connected to a ground through the said at least one conductive element.

12. A display device, comprising:
a display panel;
a light emitting diode module for providing light source to the display panel, the light emitting diode comprising:
a circuit substrate, having a first surface and a second surface, and the circuit substrate further having at least one through hole;
a first light emitting diode chip, having at least three pins and being fixed on the circuit substrate through the pins, and one of the pins being defined as a first no connection pin;
a connector, comprising at least one fixing pin and being disposed on the circuit substrate;
at least one conductive element, disposed in the said at least one through hole and electrically connected to the fixing pin; and
a conductive line, disposed on the circuit substrate and electrically connected between the fixing pin and the first no connection pin; and
a metal backplane, electrically connected to at least one conductive element.

13. The display device according to claim 12, wherein the connector further comprises a non-conductive housing, the non-conductive housing is fixed on the first surface of the circuit substrate through the said at least one fixing pin, the non-conductive housing has an opening with four outer sides, and one of the four outer sides is fixed between the first surface of the circuit substrate and the opening through the said at least one fixing pin.

14. The display device according to claim 12, wherein the connector further comprises:
a first power source pin, disposed on the circuit substrate and electrically connected to one of the remaining two pins of the first light emitting diode chip through the circuit substrate; and
a second power source pin, disposed on the circuit substrate and electrically connected to the other one of the remaining two pins of the first light emitting diode chip through the circuit substrate.

15. The display device according to claim 12, further comprising:

a second light emitting diode chip, having at least three pins and being fixed on the circuit substrate through the pins, and one of the pins being defined as a second no connection pin;

wherein the second no connection pin is electrically connected to the first no connection pin through the conductive line.

16. The display device according to claim 12, wherein the light emitting diode module is connected to a ground through the said at least one conductive element.

* * * * *